United States Patent
Nakatani et al.

(10) Patent No.: US 9,508,468 B2
(45) Date of Patent: Nov. 29, 2016

(54) NOISE SUPPRESSION CABLE, CORE ASSEMBLY, AND ELECTRICAL DEVICE

(71) Applicant: Hitachi Metals, Ltd., Tokyo (JP)

(72) Inventors: Katsutoshi Nakatani, Hitachi (JP); Yosuke Sumi, Hitachinaka (JP); Kenji Ajima, Hitachiota (JP); Katsuya Akimoto, Hitachi (JP); Naofumi Chiwata, Mito (JP); Hiroshi Okikawa, Hitachi (JP); Yasuharu Muto, Kitaibaraki (JP)

(73) Assignee: HITACHI METALS, LTD., Tokyo (JP)

(*) Notice: Subject to any disclaimer, the term of this patent is extended or adjusted under 35 U.S.C. 154(b) by 0 days.

(21) Appl. No.: 14/622,574

(22) Filed: Feb. 13, 2015

(65) Prior Publication Data
US 2015/0235738 A1 Aug. 20, 2015

(30) Foreign Application Priority Data
Feb. 19, 2014 (JP) ................. 2014-029737

(51) Int. Cl.
*H01B 11/04* (2006.01)
*H01B 9/00* (2006.01)

(52) U.S. Cl.
CPC .................... *H01B 9/006* (2013.01)

(58) Field of Classification Search
CPC ...... H01B 11/04; H01B 11/02; H01B 7/0876
USPC ............ 174/50.51, 32, 36, 60; 333/12
See application file for complete search history.

(56) References Cited

U.S. PATENT DOCUMENTS

| 7,837,085 B1* | 11/2010 | Tzviskos ............ 228/122.1 |
| 8,842,954 B2* | 9/2014 | Burris et al. ............ 385/101 |
| 2004/0130843 A1* | 7/2004 | Tsutsui ............ H01B 11/06 361/118 |
| 2010/0148766 A1* | 6/2010 | Weischedel ............ 324/238 |
| 2015/0044909 A1* | 2/2015 | Dunwoody et al. ..... 439/607.56 |

FOREIGN PATENT DOCUMENTS

| JP | 06-181012 A | 6/1994 |
| JP | 2012-255747 A | 12/2012 |

* cited by examiner

*Primary Examiner* — Hoa C Nguyen
*Assistant Examiner* — Stanley Tso
(74) *Attorney, Agent, or Firm* — McGinn IP Law Group, PLLC.

(57) ABSTRACT

A noise suppression cable includes an electrical wire, a first magnetic material including a pair of first surfaces formed along an axis direction of the electrical wire and a convex portion projecting from the first surfaces, and a second magnetic material including a pair of second surfaces disposed on a periphery of the electrical wire, the pair of the second surfaces contacting the pair of the first surfaces such that a tubular shape is formed by the first and second magnetic materials. The first magnetic material and the second magnetic material are configured to generate a compression stress in the convex portion of the first magnetic material by receiving an external force so as to reduce a relative permeability of the convex portion.

18 Claims, 3 Drawing Sheets

NOISE SUPPRESSION CABLE, CORE ASSEMBLY, AND ELECTRICAL DEVICE

The present application is based on Japanese patent application No. 2014-029737 filed on Feb. 19, 2014, the entire contents of which are incorporated herein by reference.

BACKGROUND OF THE INVENTION

1. Field of the Invention

This invention relates to a noise suppression cable, a core assembly used for the noise suppression cable and an electrical device using the noise suppression cable.

2. Description of the Related Art

For suppressing a radiation noise from a cable, a noise suppression cable has been proposed which has a signal wire, a dielectric layer disposed outside the signal wire, and a shield layer disposed outside the dielectric layer and a magnetic material layer disposed outside the shield layer, the magnetic material layer of a material including a ferrite (e.g., refer to JP-A-H06-181012).

For detecting the disconnection of an electrical wire, a disconnection detection device has been proposed which has a voltage detection part detecting a voltage value, a voltage storage part storing a voltage value detected by the voltage detection part when the power is supplied by a power supply part, and an abnormality detection part detecting an abnormality in parts from the power supply part to a power receiving part by comparing a voltage value stored in the voltage storage part and a voltage detected by the voltage detection part (e.g., refer to JP-A-2012-255747).

SUMMARY OF THE INVENTION

The noise suppression cable disclosed in JP-A-H06-181012 can suppress the radiation noise, but cannot control the emission direction of the radiation noise. For this reason, in order to detect the signal-wire disconnection of the noise suppression cable, the disconnection detection device disclosed in JP-A-2012-255747 may be further needed. Thus, a problem may arise that the detection of the signal-wire disconnection is complicated in device construction and operation.

It is an object of the invention to provide a noise suppression cable that is capable of suppressing the radiation noise and controlling the emission direction of the radiation noise, as well as a core assembly used for the noise suppression cable.

It is another object of the invention to provide an electrical device that is capable of suppressing the radiation noise and detecting the signal-wire disconnection with a simple construction.

(1) According to one embodiment of the invention, a noise suppression cable comprises:
 an electrical wire;
 a first magnetic material comprising a pair of first surfaces formed along an axis direction of the electrical wire and a convex portion projecting from the first surfaces; and
 a second magnetic material comprising a pair of second surfaces disposed on a periphery of the electrical wire, the pair of the second surfaces contacting the pair of the first surfaces such that a tubular shape is formed by the first and second magnetic materials,
 wherein the first magnetic material and the second magnetic material are configured to generate a compression stress in the convex portion of the first magnetic material by receiving an external force so as to reduce a relative permeability of the convex portion.

In the above embodiment (1) of the invention, the following modifications and changes can be made.

(i) The second magnetic material further comprises a concave portion corresponding to the convex portion in the second surfaces, and
 wherein a height of the convex portion from the first surface is more than a depth of the concave portion from the second surface.

(ii) The convex portion is disposed at one of the pair of the first surfaces, and wherein the concave portion is disposed at one of the pair of the second surfaces.

(2) According to another embodiment of the invention, a core assembly comprises the first magnetic material and the second magnetic material according to the above embodiment (1).

(3) According to another embodiment of the invention, an electrical device comprises:
 the noise suppression cable according to the embodiment (1);
 a detection element to detect a magnetic flux emitted from the noise suppression cable; and
 a substrate on which the noise suppression cable and the detection element are mounted.

Effects of the Invention

According to one embodiment of the invention, a noise suppression cable can be provided that is capable of suppressing the radiation noise and controlling the emission direction of the radiation noise, as well as a core assembly used for the noise suppression cable. Also, according to another embodiment of the invention, an electrical device can be provided that is capable of suppressing the radiation noise and detecting the signal-wire disconnection with a simple construction.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Figure 1:
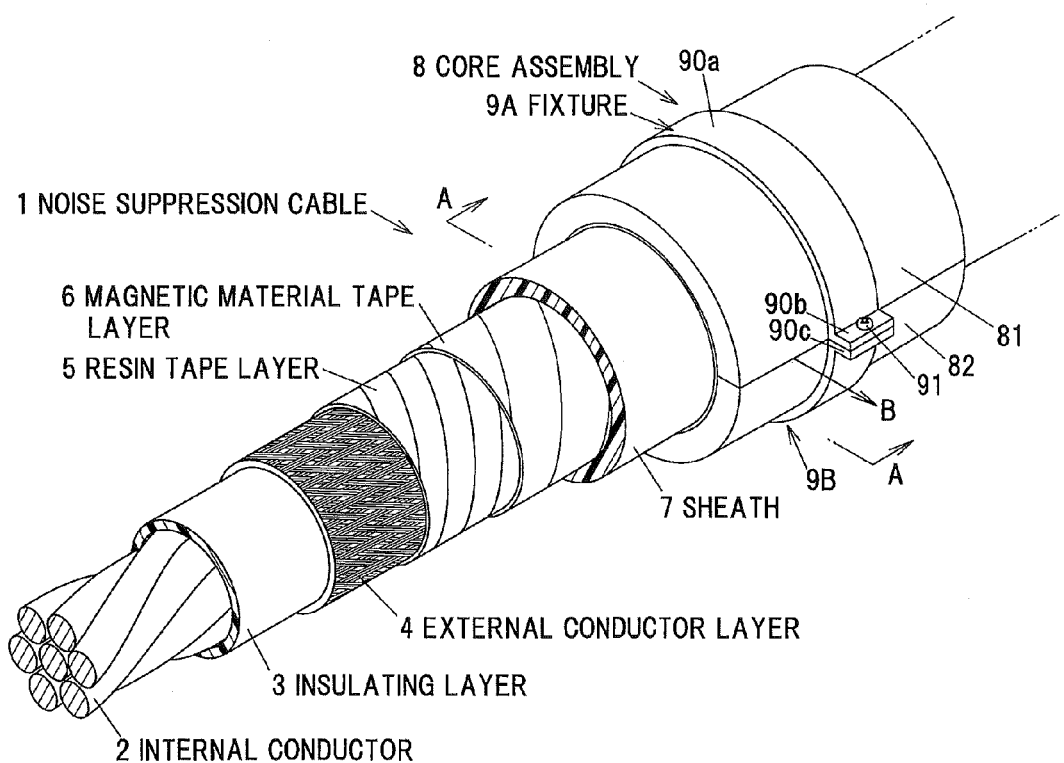
FIG. 1 is a perspective view schematically showing a noise suppression cable according to a first embodiment of the invention.

Hereinafter, the embodiments according to the invention will be explained referring to the drawings. Further, in each of the drawings, with regard to the components having the substantially same function, the same reference signs will be used, and the detail explanation will be omitted.

First Embodiment

Figure 2:
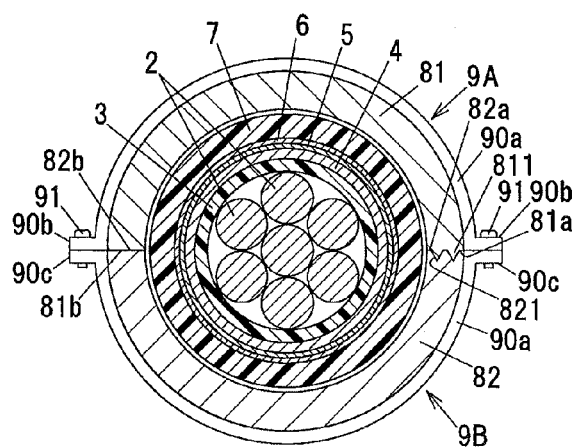
FIG. 2 is a cross-sectional view taken along the line A-A in FIG. 1.

FIG. 1 is a perspective view schematically showing a noise suppression cable according to a first embodiment of the invention. FIG. 2 is a cross-sectional view taken along the line A-A in FIG. 1.

The noise suppression cable 1 includes internal conductors 2 constituted of a plurality (7 in the embodiment) of conductors which are stranded, an insulating layer 3 covering the periphery of a plurality of the internal conductors 2 so as to insulate the internal conductors, an external conductor layer 4 formed on the periphery of the insulating layer 3, a resin tape layer 5 formed on the periphery of the external conductor layer 4, a magnetic material tape layer 6 formed on the periphery of the resin tape layer 5, a sheath 7 formed on the periphery of the magnetic material tape layer 6 as an insulating protective layer, the sheath 7 being comprised of a resin or the like, a core assembly 8 formed on the periphery of the sheath 7, and a pair of fixtures 9A, 9B configured to fix the core assembly 8 to the sheath 7 by fastening a screw. Further, the resin tape layer 5, the insulating layer 3, the external conductor layer 4, the resin tape layer 5, the magnetic material tape layer 6, and the sheath 7 are one example of an electrical wire.

The internal conductors 2 are signal wires constituted of a metal such as a copper alloy, and for example, to transmit a signal of 1 kHz to 10 kHz. Further, the internal conductors 2 may be constituted of a single wire. In addition, each conductor of the internal conductors 2 can be covered. The insulating layer 3 is formed by, for example, an extrusion molding by using a vinyl chloride resin, an ethylene-vinyl acetate copolymer, a fluorine based resin, a silicone based resin or the like.

The external conductor layer 4 is formed by, for example, braiding thin wires comprised of a metal such as a copper alloy, so as to be connected to a ground of a device or the like to which the noise suppression cable 1 is connected.

The resin tape layer 5 is formed by, for example, by winding a resin tape on the periphery of the external conductor layer 4 along the longitudinal direction of the noise suppression cable 1. As the resin tape, for example, a tape comprised of a resin such as a polyethylene terephthalate (PET) resin, a polypropylene based resin can be used.

The sheath 7 is formed by, for example, similarly to the insulating layer 3, an extrusion molding by using a vinyl chloride resin, an ethylene-vinyl acetate copolymer, a fluorine based resin, a silicone based resin or the like. Further, the sheath 7 and the insulating layer 3 can be constituted of a heat shrinkable tube or the like.

The fixture 9A includes a main body 90a having an almost C-shape and seat portions 90b disposed on both ends of the main body 90a. In the seat portion 90b, a hole (not shown) through which a screw 91 is passed is formed. The fixture 9B includes a main body 90a having an almost C-shape and seat portions 90c disposed on both ends of the main body 90a. In the seat portion 90c, a screw hole (not shown) with which a screw 91 is fastened is formed. The fixtures 9A, 9B are comprised of, for example, a metal such as a carbon steel.

(Core Assembly)

Figure 3A:
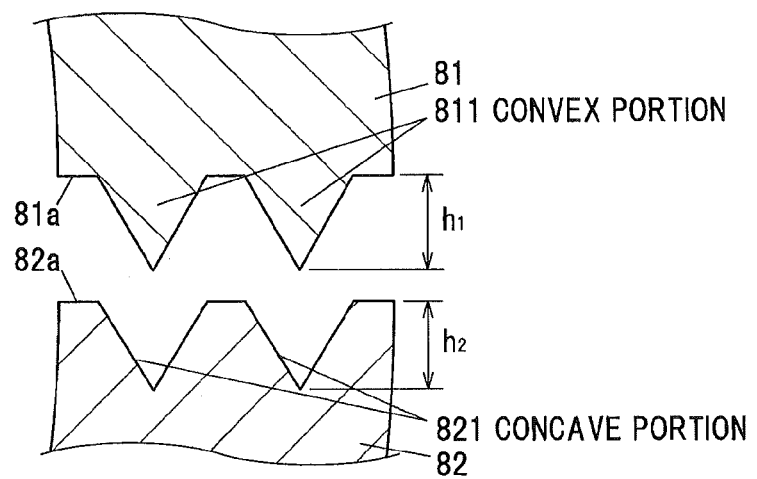
FIG. 3A is a transverse cross-sectional view schematically showing a principal part of a core assembly before assembly.
Figure 3B:
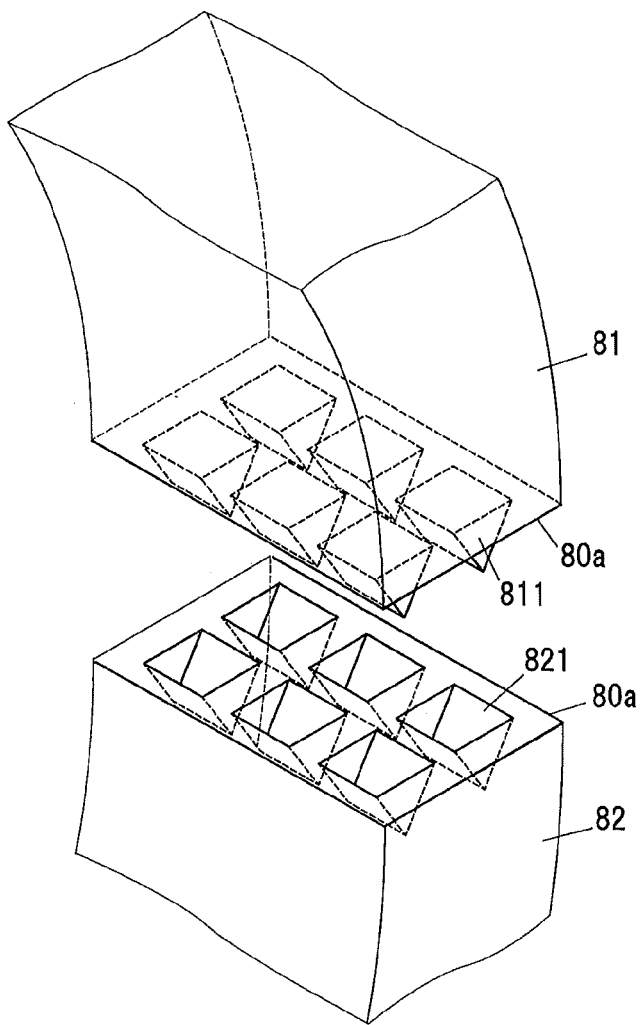
FIG. 3B is a perspective view schematically showing a principal part of a core assembly before assembly.

FIG. 3A is a transverse cross-sectional view schematically showing a principal part of a core assembly before assembly. FIG. 3B is a perspective view schematically showing a principal part of a core assembly before assembly. The core assembly 8 has, for example, an almost cylindrical shape in cross-section, and be divided into two parts by a pair of first surfaces 81a, 81b and a pair of second surfaces 82a, 82b along the axis direction of the almost cylindrical shape. The core assembly 8 is configured such that a first magnetic material 81 formed in an almost arc shape and a second magnetic material 82 formed in an almost arc shape similarly to the first magnetic material 81 are combined with each other in the first and second surfaces 81a, 81b, 82a, 82b. Further, the cross-sectional shape of the core assembly 8 is not particularly limited so long as it is a tubular shape, but for example, it may be a polygonal shape such as a rectangular shape or a rectangular shape of which corners are rounded.

In order to suppress radiation noise, it is exemplary that the first and second magnetic materials 81, 82 are comprised of a soft magnetic material that has a small coercive force and a high permeability. As the soft magnetic material, for example, an amorphous alloy such as a Co-based amorphous alloy, a Fe-based amorphous alloy; a ferrite such as a Mn—Zn-based ferrite, a Ni—Zn-based ferrite, a Ni—Zn—Cu-based ferrite; a soft magnetic metal such as a Fe—Ni-based alloy (Permalloy), a Fe—Si—Al-based alloy (Sendust), a Fe—Si-based alloy (silicone steel); and the like can be used. The first and second magnetic materials 81, 82 are manufactured by, for example, molding powder of the above-mentioned soft magnetic material and sintering the molded soft magnetic material.

The first magnetic material 81 has a plurality (6 in the embodiment) of convex portions 811 having a triangular shape in cross-section and projecting from the first surface 81a. The second magnetic material 82 has a plurality (6 in the embodiment) of concave portions 821 on the second surface 82a, the concave portions 821 corresponding to a plurality of the convex portions 811 of the first magnetic material 81 and having a triangular shape in cross-section. Further, the shape of the convex portion 811 may be a conical shape, a columnar shape, a prismatic shape or the like.

The convex portion 811 and the concave portion 821 are formed in plural rows (2 rows in the embodiment) at intervals along the axis direction of the core assembly 8. The convex portion 811 has a shape that the height ($h_1$) from the first surface 81a is larger than the depth ($h_2$) of the concave portion 821 from the second surface 82a. It is exemplary that a difference between the height ($h_1$) of the convex portion 811 and the depth ($h_2$) of the concave portion 821 falls within the range of approximately 0.05 mm to approximately 0.5 mm. Further, the one or not less than seven convex portion 811 and concave portion 821 may be formed on the first surface 81a and the second surface 82a. In addition, the convex portion 811 and the concave portion 821 may be also formed on the first surface 81b and the second surface 82b. Further, the convex portion 811 and the concave portion 821 may be formed continuously in the axis direction of the core assembly 8.

The core assembly 8 is assembled, for example, as follows. First, the sheath 7 of the noise suppression cable 1 is sandwiched, in a predetermined position thereof, between the first magnetic material 81 and the second magnetic material 82. Next, the first and second magnetic materials 81, 82 are held, in the outer periphery thereof, by the fixtures 9A, 9B and the screws are fastened. Due to this, the first and second magnetic materials 81, 82 themselves are pressed in a direction approaching each other, and the convex portions 811 of the first magnetic material 81 are fitted in the concave portions 821 of the second magnetic material 82. Furthermore, when the screws 91 are fastened, the first surfaces

81a, 81b and the second surfaces 82a, 82b are brought into contact with each other, and compression stress occurs in the convex portion 811 and the concave portion 821. Parts of the convex portion 811 and the concave portion 821 in which compression stress occurs are reduced in the relative permeability in comparison with the parts of the first and second magnetic materials 81, 82 in which compression stress does not occur.

(Action of Noise Suppression Cable)

Next, an action of the noise suppression cable 1 is explained. When the internal conductor 2 of the noise suppression cable 1 transmits signals of for example, 1 kHz to 10 MHz, the signals transmitted through the internal conductor 2 generate magnetic flux inside of the core assembly 8 in the circumferential direction of the core assembly 8.

A part of the magnetic flux generated in the core assembly 8 is emitted from the regions of the first and second magnetic materials 81, 82 in which relative permeability is reduced to the normal direction of the core assembly 8, namely to the "B" direction shown in FIG. 1 from the first and second surfaces 81a, 82a located in the one side.

(Advantageous Effect of First Embodiment)

According to the embodiment, the following advantageous effect is provided.

(1) By generating compression stress in a part of the core assembly 8 mounted on the electric wire so as to reduce relative permeability, the magnetic flux (radiation noise) can be exteriorly emitted from the part thereof in which the relative permeability is reduced. Namely, it becomes possible to control the direction of the radiation noise emitted from the core assembly 8.

(2) By forming the convex portion 811 and the concave portion 821 on the first and second surfaces 81a, 82a located in the one side, it becomes possible to emit the core magnetic flux from the first and second surfaces 81a, 82a located in the one side, and simultaneously to control the magnetic flux so as not to leak from the first and second surfaces 81b, 82b located in the other side of the core assembly 8.

Second Embodiment

Figure 4:
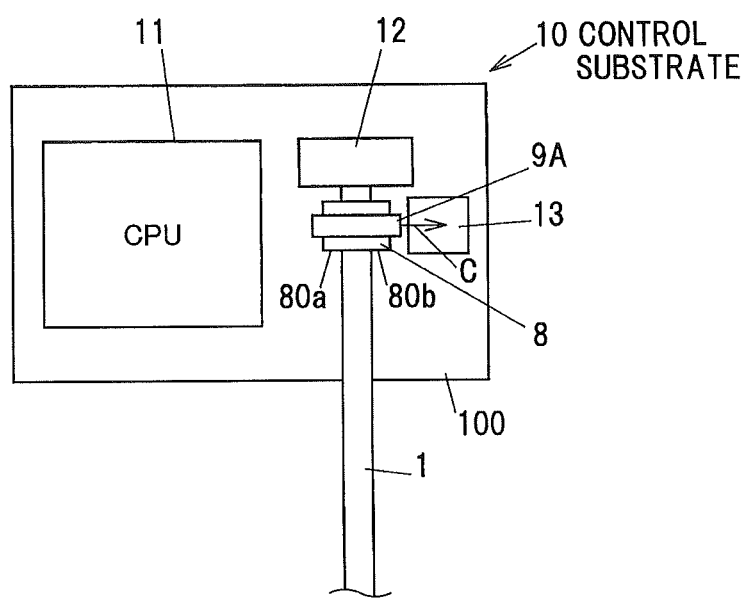
FIG. 4 is a top view schematically showing a control substrate according to a second embodiment of the invention.

FIG. 4 is a top view schematically showing a control substrate according to the second embodiment of the invention. The control substrate 10 according to the embodiment is a substrate configured such that the noise suppression cable 1 according to the first embodiment is mounted. Hereinafter, different points from the first embodiment will be mainly explained.

The control substrate 10 according to the embodiment is mounted on, for example, an electrical device so as to control each part of the electrical device. The control substrate 10 includes a CPU 11 configured to execute a predetermined processing based on a program stored in a storage part not shown, a connection part 12 configured to connect the noise suppression cable 1 to the control substrate 10, a magnetic sensor 13 configured to detect the magnetic flux emitted from the core assembly 8 of the noise suppression cable 1 and a printed circuit board 100 configured such that the CPU 11, the connection part 12, the magnetic sensor 13 and the noise suppression cable 1 are mounted thereon. To the end part opposite to the connection part 12 of the noise suppression cable 1, for example, an electrical device not shown is connected. Further, the magnetic sensor 13 is one example of the detection element.

The magnetic sensor 13 is arranged on the side of the first and second surfaces 81a, 82a located in the one side of the core assembly 8, and the CPU 11 is arranged on the side of the first and second surfaces 81b, 82b located in the other side thereof.

(Operation of Control Substrate)

Next, one example of an operation of the control substrate 10 is explained.

The CPU 11 is configured to transmit signals to the noise suppression cable 1 via the connection part 12 when executing a predetermined processing, and simultaneously to receive signals transmitted from the other electrical device or the like via the noise suppression cable 1.

The magnetic sensor 13 is configured to detect a magnetic flux density based on the magnetic flux C emitted from the first and second surfaces 81a, 82a so as to output the detection result to the CPU 11.

The CPU 11 is configured to compare the magnetic flux density detected by the magnetic sensor 13 and the threshold value of the magnetic flux density, and in case of judging that the magnetic flux density detected is lower than the threshold value, to decide that signals do not flow through the noise suppression cable 1, and in case of judging that the magnetic flux density detected is higher than the threshold value, to decide that signals flow through the noise suppression cable 1. The CPU is configured to judge that disconnection of the internal conductor 2 of the noise suppression cable 1 or breakdown of the connection part 12 and the like occur, in case of detecting no signals flowing through the noise suppression cable 1 by the magnetic sensor 13 in spite of outputting signals to the noise suppression cable 1.

The CPU 11 is configured to display an occurrence of disconnection or breakdown on a screen not shown or the like when judging that disconnection of the internal conductor 2 of the noise suppression cable 1 or breakdown of the connection part 12 and the like occur. Further, the occurrence of disconnection or breakdown may be notified by a buzzer or the like.

(Advantageous Effect of Second Embodiment)

According to the embodiment, the following advantageous effect is provided.

(1) By mounting the noise suppression cable 1 including the core assembly 8 on the control substrate 10, it becomes possible to detect disconnection of the internal conductor 2 of the noise suppression cable 1 or breakdown of the connection part 12 and the like based on the magnetic flux emitted from the noise suppression cable 1.

(2) By controlling the direction of the magnetic flux (radiation noise) generated from the noise suppression cable 1, it becomes possible to suppress the CPU or the like arranged on the side opposite to the magnetic sensor 13 from being exposed to the magnetic flux.

(3) With a small number of components and a simple configuration, it becomes possible to suppress the radiation noise, and simultaneously to detect disconnection of the internal conductor 2 of the noise suppression cable 1 or breakdown of the connection part 12 and the like.

[Modifications]

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth. For example, the noise suppression cable 1 may be a cable that does not include the resin tape layer 5 and the magnetic material tape layer 6.

In addition, a configuration may be adopted that the second magnetic material 82 does not include the concave portions 821, and the convex portion 811 of the first magnetic material 81 is projected from the first surface 81a within the range of approximately 0.05 mm to approximately 0.5 mm.

In addition, in the second embodiment, a configuration may be also adopted that a noise level of the radiation noise generated from the noise suppression cable 1 is detected based on the magnetic flux density detected by the magnetic sensor 13.

In addition, a configuration may be also adopted that for example, an antenna is connected to the end part opposite to the connection part 12 of the noise suppression cable 1, and the control substrate 10 is configured to input an electric wave received by the antenna, and simultaneously to supply electric power to the antenna. Due to this, it becomes possible to detect disconnection of the internal conductor 2 of the noise suppression cable 1 or the like in accordance with a detection result of the magnetic flux density by the magnetic sensor 13 based on the electric wave.

What is claimed is:

1. A noise suppression cable, comprising:
   an electrical wire; and
   a core assembly comprising a tubular shape and provided around a periphery of the electrical wire,
   the core assembly comprising:
      a first magnetic material comprising a pair of first surfaces formed along a longitudinal direction of the electrical wire of the core assembly and a convex portion projecting from the first surfaces; and
      a second magnetic material comprising a pair of second surfaces formed along the longitudinal direction of the electrical wire of the core assembly,
   wherein the pair of the second surfaces of the second magnetic material contacts the pair of the first surfaces of the first magnetic material,
   wherein the first magnetic material and the second magnetic material are configured to generate a compression stress in the convex portion of the first magnetic material by receiving an external force so as to reduce a relative permeability of the convex portion,
   wherein, at one edge of the core assembly, the convex portion comprises a plurality of convex portions projecting from one of the pair of first surfaces toward the second magnetic material,
   wherein the second magnetic material further comprises a plurality of concave portions extending from one of the pair of second surfaces toward an inside of the second magnetic material, each of the concave portions corresponding to each of the convex portions, and
   wherein, at the other edge of the core assembly, an entirety of another one of the pair of the first surfaces and another one of the pair of the second surfaces contact each other flatly.

2. The noise suppression cable according to claim 1, wherein the second magnetic material further comprises a concave portion in the second surfaces, the concave portion corresponding to the convex portion, and
   wherein a height of the convex portion from one of the first surfaces is more than a depth of the concave portion from one of the second surfaces.

3. The noise suppression cable according to claim 2, wherein the convex portion is disposed at one of the pair of the first surfaces, and
   wherein the concave portion is disposed at one of the pair of the second surfaces.

4. The noise suppression cable according to claim 2, wherein the convex portion and the concave portion are arranged with an interval in plural lines along the longitudinal direction of the electrical wire of the core assembly.

5. A core assembly, comprising the first magnetic material and the second magnetic material according to the claim 1.

6. An electrical device, comprising:
   the noise suppression cable according to claim 1;
   a detection element to detect a magnetic flux emitted from the noise suppression cable; and
   a substrate on which the noise suppression cable and the detection element are mounted.

7. The electrical device according to claim 6, wherein the detection element is provided on both of the first magnetic material and the second magnetic material of the core assembly.

8. The electrical device according to claim 6, wherein the detection element comprises a magnetic sensor.

9. The electrical device according to claim 6, wherein the detection element is configured to detect a magnetic flux density based on the magnetic flux emitted from the first surfaces of the first magnetic material and the second surfaces of the second magnetic material of the core assembly.

10. The electrical device, according to claim 6, further comprising:
    a CPU configured to compare a magnetic flux density detected by the detection element and a threshold value of the magnetic flux density.

11. The noise suppression cable according to claim 1, further comprising:
    a pair of fixtures formed to cover an outer periphery surface of the first magnetic material and an outer periphery surface of the second magnetic material.

12. The noise suppression cable according to claim 11, wherein each of the pair of fixtures comprises a main body substantially having a C-shape and seat portions provided at both ends of the main body.

13. The noise suppression cable according to claim 1, wherein the electrical wire comprises:
    internal conductors comprising a plurality of conductors which are stranded;
    an insulating layer covering a periphery of the internal conductors to insulate the internal conductors; and
    an external conductor layer disposed on a periphery of the insulating layer.

14. The noise suppression cable according to claim 13, wherein the electrical wire further comprises:
    a resin tape layer disposed on a periphery of the external conductor layer;
    a magnetic material tape layer disposed on the periphery of the resin tape layer; and
    a sheath disposed on a periphery of the magnetic material tape layer as an insulating protective layer.

15. The noise suppression cable according to claim 14, wherein the sheath comprises a resin, and
    wherein the core assembly is disposed on a surface of the sheath.

16. The noise suppression cable according to claim 15, wherein the sheath is sandwiched between the first magnetic material and the second magnetic material.

17. The noise suppression cable according to claim 16, further comprising:
    a pair of fixtures sandwiching an outer periphery surface of the first magnetic material and an outer periphery surface of the second magnetic material.

18. The noise suppression cable according to claim 1, wherein a height of said each of the convex portions from said one of the first surfaces is more than a depth of each of the concave portion from said one of the second surfaces.

\* \* \* \* \*